United States Patent
Wu et al.

(10) Patent No.: US 11,199,872 B2
(45) Date of Patent: Dec. 14, 2021

(54) FOLDABLE DISPLAY DEVICE WITH BIOMETRIC SENSORS AND METHOD FOR DRIVING THE SAME

(71) Applicant: InnoLux Corporation, Miao-Li County (TW)

(72) Inventors: Yuan-Lin Wu, Miao-Li County (TW); Chandra Lius, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 293 days.

(21) Appl. No.: 16/175,818

(22) Filed: Oct. 30, 2018

(65) Prior Publication Data

US 2020/0133335 A1    Apr. 30, 2020

(51) Int. Cl.
*G06F 1/16* (2006.01)
*G06K 9/00* (2006.01)
*H05K 1/18* (2006.01)

(52) U.S. Cl.
CPC ......... *G06F 1/1616* (2013.01); *G06K 9/0002* (2013.01); *G06K 9/0004* (2013.01); *G06K 9/00597* (2013.01); *H05K 1/189* (2013.01)

(58) Field of Classification Search
CPC ...... G06F 1/1652; G06F 21/32; G06F 3/0416; G06F 3/044; G06F 2203/04102; G06F 2203/04106; G06K 9/0002; G06K 9/00362; H04L 43/0876; H04L 47/10; G07C 9/00
See application file for complete search history.

(56) References Cited

U.S. PATENT DOCUMENTS

| | | | | |
|---|---|---|---|---|
| 7,633,744 | B2 * | 12/2009 | Kuhn | G06F 1/1622 361/679.04 |
| 10,367,173 | B1 * | 7/2019 | Wu | G02B 1/14 |
| 10,642,313 | B1 * | 5/2020 | Wu | G06K 9/0002 |
| 2009/0167691 | A1 * | 7/2009 | Wang | G06F 1/1667 345/168 |
| 2014/0218327 | A1 | 8/2014 | Shi | |
| 2014/0285476 | A1 * | 9/2014 | Cho | H04M 1/0268 345/204 |
| 2016/0187994 | A1 * | 6/2016 | La | G06F 1/1677 345/619 |
| 2016/0381014 | A1 * | 12/2016 | Kim | G06F 1/1694 726/7 |
| 2018/0157361 | A1 * | 6/2018 | Kim | G06F 3/044 |
| 2018/0160545 | A1 * | 6/2018 | Kim | H05K 1/028 |
| 2018/0196989 | A1 | 7/2018 | Hong | |
| 2020/0089933 | A1 * | 3/2020 | Lius | G06F 1/3262 |
| 2020/0209917 | A1 * | 7/2020 | Zhou | G06F 21/32 |

FOREIGN PATENT DOCUMENTS

| | | | | |
|---|---|---|---|---|
| CN | 206023855 | U | * | 3/2017 |
| CN | 107765835 | A | * | 3/2018 |
| CN | 107765835 | A | | 3/2018 |

* cited by examiner

*Primary Examiner* — Mekonen T Bekele
(74) *Attorney, Agent, or Firm* — Winston Hsu

(57) ABSTRACT

A foldable display device is disclosed and has a first display region, a second display region, and a foldable region connecting the first display region and the second display region. The foldable display device includes a first biometric sensor disposed in the first display region and a second biometric sensor disposed in the second display region.

18 Claims, 12 Drawing Sheets

FOLDABLE DISPLAY DEVICE WITH BIOMETRIC SENSORS AND METHOD FOR DRIVING THE SAME

BACKGROUND OF THE DISCLOSURE

1. Field of the Disclosure

The present disclosure relates to a foldable display device with biometric sensors and a method for driving the foldable display device, and more particularly to a foldable display device with at least two biometric sensors in at least two display regions and a method for driving the foldable display device.

2. Description of the Prior Art

In recent years, foldable electronic device has become one of next generation technologies. The foldable electronic device offers portability when in a folded state and expands into a relatively large sized display when in an unfolded state, and accordingly, the foldable electronic device may have various applications in electronic displays used in televisions, monitors, mobile computing devices, such as smartphones, tablet computers, mobile personal computers (PCs), and electronic book readers, and wearable devices, such as smart watches. For this reason, the foldable electronic device may store a lot of information including personal private information. For securing the private information, biometric recognition is developed. However, in the conventional technique, only one biometric sensor may be integrated in the electronic device, and therefore, only one access restriction approach, such as one fingerprint identification at one time, is achieved. As a result, the protection of information with different security level stored in the electronic device is limited, and to increase access restriction approach is still in need.

SUMMARY OF THE DISCLOSURE

According to some embodiments, a foldable display device is disclosed and has a first display region, a second display region, and a foldable region connecting the first display region and the second display region. The foldable display device includes a first biometric sensor disposed in the first display region and a second biometric sensor disposed in the second display region.

According to some embodiments, a method for driving a foldable display device is disclosed. The foldable display device has a first display region, a second display region, and a foldable region connecting the first display region and the second display region. The method includes providing a first biometric sensor and a second biometric sensor, wherein the first biometric sensor and the second biometric sensor are disposed in the first display region and the second display region of the foldable display device respectively; performing a biometric sensing operation, which includes using the first biometric sensor to detect at least one first biological feature of a user and using the second biometric sensor to detect at least one second biological feature of the user in a period of time; and when the at least first biological feature matches at least one first biological datum and the at least second biological feature matches at least one second biological datum, allowing a security access operation to be performed by the foldable display device.

According to some embodiments, a method for driving a foldable display device is disclosed. The method includes providing the display device having a display region, wherein a biometric sensor is disposed in the display region; performing a biometric sensing operation with the biometric sensor at a certain frequency; judging whether a user using the display device is a specific person; when the user is the specific person, allowing the user to operate all functions in the display device; and when the user is not the specific person, forbidding the user to operate specific functions in the display device.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the display device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ".

It will be understood that when an element or layer is referred to as being "on" or "connected to" another element or layer, it can be directly on or directly connected to the other element or layer, or intervening elements or layers may be present (indirectly). In contrast, when an element is referred to as being "directly on" or "directly connected to" another element or layer, there are no intervening elements or layers present.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

Figure 1:
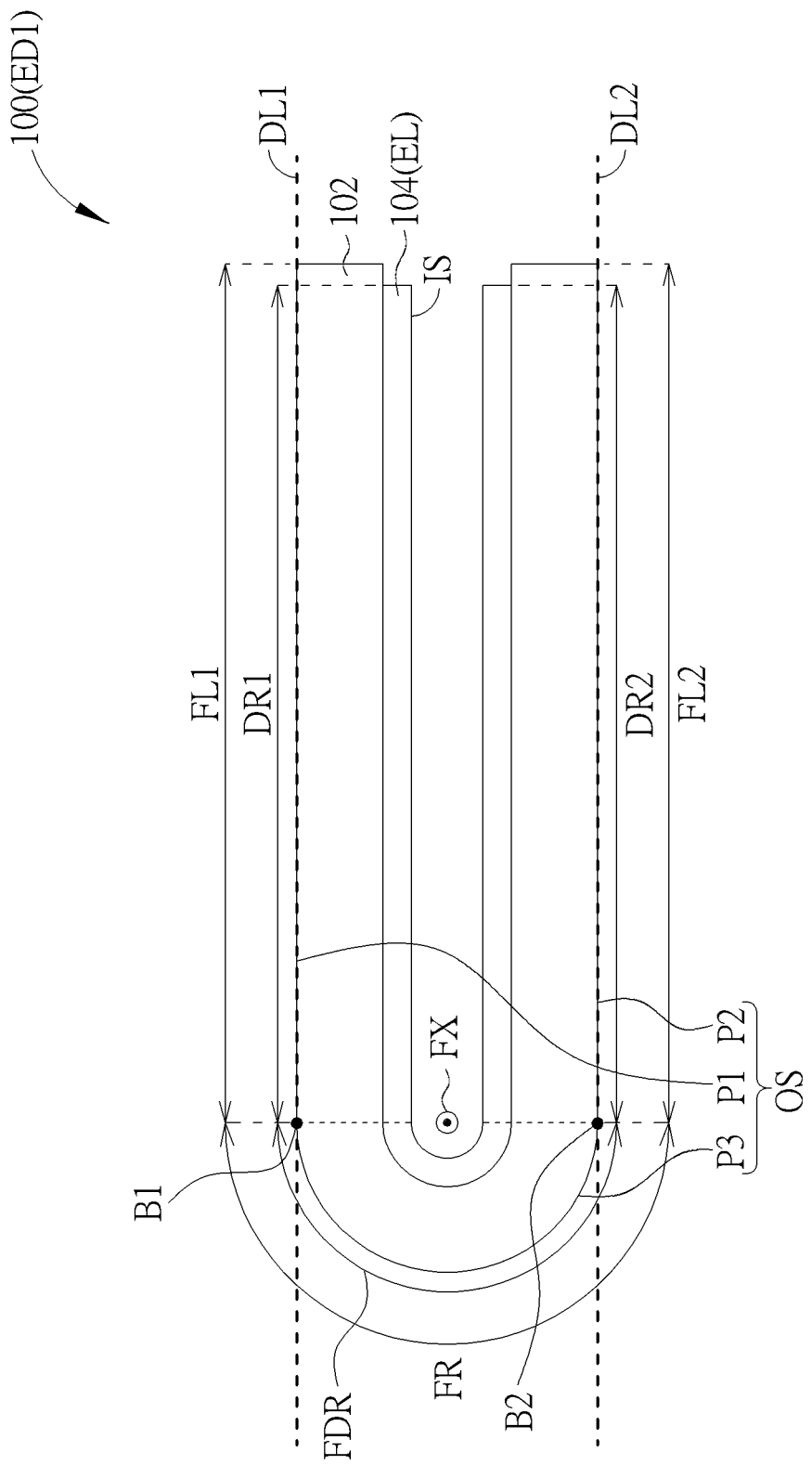
FIG. 1 schematically illustrates an electronic device according to a first embodiment of the present disclosure.

Refer to FIG. 1 which schematically illustrating an electronic device according to a first embodiment of the present disclosure. The electronic device of this embodiment is a foldable electronic device ED1. For example, the foldable electronic device ED1 can be folded along a folding axis FX shown in FIG. 1. Specifically, the foldable electronic device ED1 has a first flat region FL1, a second flat region FL2 and a foldable region FR connected between the first flat region FL1 and the second flat region FL2, in which the foldable electronic device ED1 in the foldable region FR is capable of being curved, bent, and/or folded. In some embodiments, the foldable region may be plural, and the flat regions may be at least three.

More detailed, the foldable electronic device ED1 may have an outer surface OS, and the outer surface OS has a first surface part P1 defining the first flat region FL1, a second surface part P2 defining the second flat region FL2 and a third surface part P3 defining the foldable region FR. When the foldable electronic device ED1 is expanded to an unfolded state, the first surface part P1, the second surface part P2 and the third surface part P3 are in level with the same plane. When the foldable electronic device ED1 is folded to an folded state, the first surface part P1 is substantially flat and in level with a plane (as the dotted line DL1 shown in FIG. 1), the second surface part P2 is substantially flat and in level with another plane (as the dotted line DL2 shown in FIG. 1), and the third surface part P3 is bent and not in level with the planes. Accordingly, the third surface part P3 can be defined between the planes (dotted lines DL1 and DL2) while the foldable electronic device ED1 is at the folded state. Namely, when the foldable electronic device ED1 is at the folded state, the boundary B1 between the first part P1 and the third part P3 can be defined by a position of the outer surface OS that starts to be away from the plane (dotted line DL1) of the first surface part P1, and the boundary B2 between the second part P2 and the third part P3 can be defined by another position of the outer surface OS that starts to be away from the plane (dotted line DL2). Similar to the outer surface OS, an inner surface IS of the foldable electronic device ED1 opposite to the outer surface OS may be defined to have the first flat region FL1, the second flat region FL2 and the foldable region FR.

The foldable electronic device ED1 of the present disclosure can include a flexible substrate 102, and an electronic layer EL disposed on the flexible substrate 102. In this embodiment, the foldable electronic device ED1 can be a foldable display device 100, and the electronic layer EL can include a driving layer (not shown) and a display layer 104 capable of displaying images. The driving layer may include a plurality of thin-film transistors, the thin-film transistors can electrically connected to the display layer 104. In another embodiment, the driving layer may integrate with the display layer 104. For example, the display layer 104 may include a plurality of light-emitting diodes, such as inorganic light-emitting diodes, quantum dot light-emitting diodes or organic light-emitting diodes, and therefore, the foldable display device 100 may be a self-luminous display device, but not limited thereto. In an embodiment, for inorganic light-emitting diodes, each light-emitting diode (LED) may be a chip with inorganic light emitting material for emitting light, for example the chip size of a mini-LED is in a range from 100 μm to 300 μm, or the chip size of a micro-LED is in a range from 1 μm to 100 μm. In some embodiments, the flexible substrate 102 may include any insulating material that is flexible. For example, the insulating material may include polyethylene terephthalate (PET), polyimide (PI), or polyethylene naphthalate (PEN), or combination thereof, but not limited thereto. According to some embodiments, the electronic layer EL can have no display function; for example, can include an antenna, for example a liquid crystal antenna. In such situation, the electronic layer EL may include a medium layer and a circuit layer. The medium layer can be a liquid crystal layer or other suitable medium materials, the circuit layer can be fabricated by thin film processes, and can optionally include switches (ex. TFTs), and thus the foldable electronic device ED1 can be a flexible antenna, for example a liquid crystal antenna.

Figure 2:
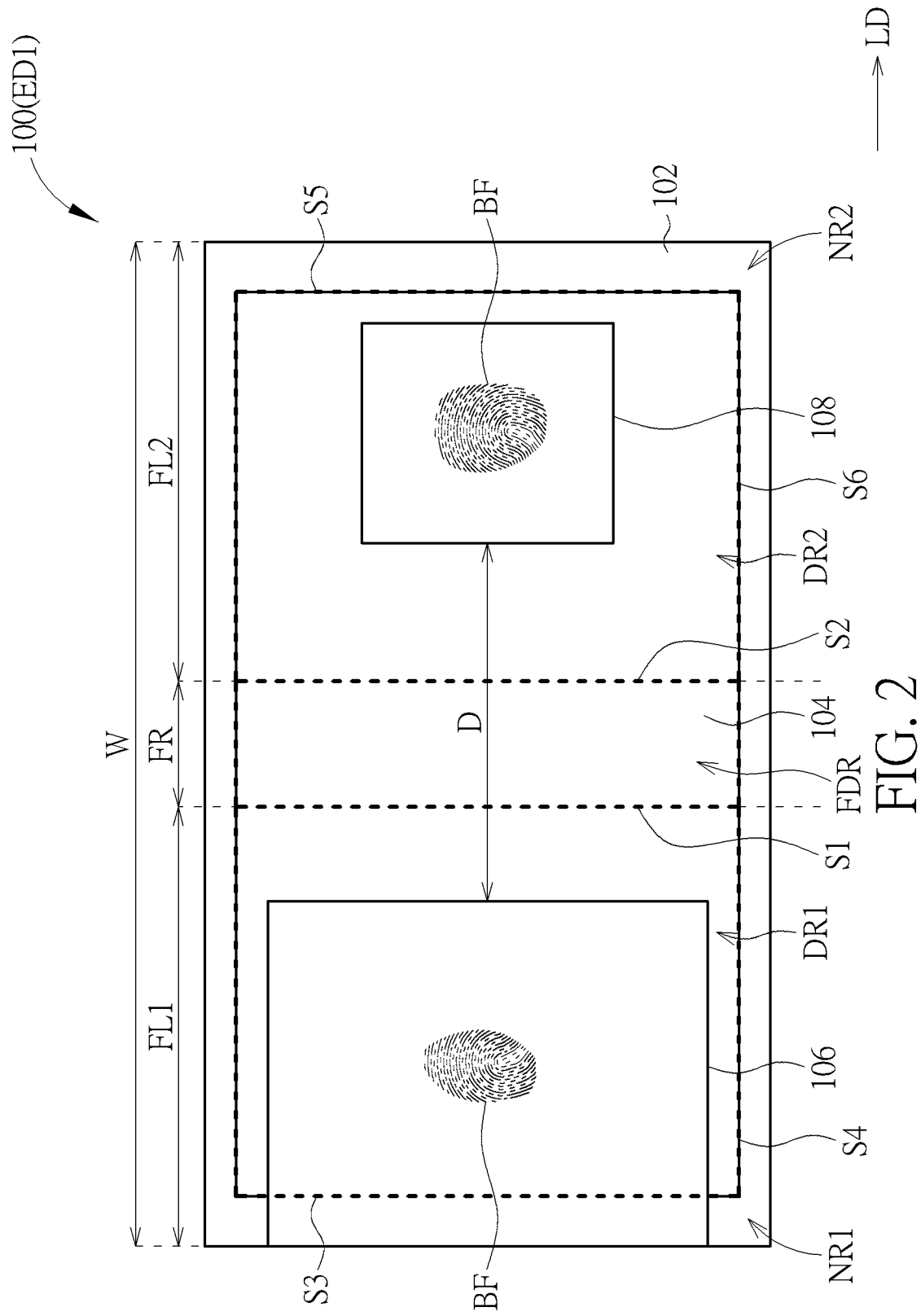
FIG. 2 schematically illustrates a top view of the foldable display device when the foldable display device is at unfolded state according to the first embodiment of the present disclosure.

For easy explanation, some examples are taken when the electronic layer EL is the display layer 104 in the following descriptions of the present disclosure. Thus, as shown in FIG. 1, the foldable display device 100 is taken as an exemplary of the foldable electronic device ED1. Refer to FIG. 2 together with FIG. 1. FIG. 2 schematically illustrates a top view of the foldable display device when the foldable display device is at unfolded state according to the first embodiment of the present disclosure. Edges of the display layer 104 may define a display region. For example, the display region may be defined by connecting outer sides of the outmost light-emitting diodes. The display region of the foldable display device 100 may include a first display region DR1 and a second display region DR2, in which the first display region DR1 is located in the first flat region FL1, and the second display region DR2 is located in the second flat region FL2. The foldable region FR connects the first display region DR1 and the second display region DR2.

In some embodiments, the display layer 104 may optionally include a foldable display region FDR disposed correspondingly in the foldable region FR. The foldable region FR connects the first display region DR1 and the second display region DR2. In an embodiment, the edges of the foldable display region FDR may align with the edges of the first display region DR1 or the second display region DR2. The foldable display region FDR connects the first display region DR1 and the second display region DR2. The display layer 104 may extend from the first display region DR1 through the foldable region FR to the second display region DR2. Thus, three edges of the first display region DR1 that are not connected to the foldable region FR may be defined by three edges of the display layer 104 in the first flat region FL1, and three edges of the second display region DR2 that are not connected to the foldable region FR may be defined by three edges of the display layer 104 in the second flat region FL2.

In some embodiments, the display layer 104 may not be disposed in the foldable region FR, so the display layer 104 may be divided by the foldable region FR into two display structure portions disposed on the same flexible substrate 102 and in the first display region DR1 and the second display region DR2 respectively. The foldable region FR connects the first display region DR1 and the second display region DR2. In some embodiments, the display structure portions may be disposed on two different flexible substrates, and the flexible substrates may be connected by a hinge structure (not shown), so the foldable display device can be folded through the hinge structure, and the hinge structure connects the flexible substrates.

The foldable display device 100 further includes a first biometric sensor 106 disposed in the first display region DR1 and a second biometric sensor 108 disposed in the second display region DR2. The first biometric sensor 106 and the second biometric sensor 108 are used for sensing biological feature BF. Biological feature can be fingerprint, palm print, face feature, eye feature, iris feature, or other suitable recognition features. In some embodiments, the first biometric sensor 106 and the second biometric sensor 108 may be of different types or the same type. For example, biological features sensed by the first biometric sensor 106 and the second biometric sensor 108 may be of the same kind or different kinds. For example, the first biometric sensor 106 can sense fingerprint, and the second biometric sensor 108 can sense iris feature. For example, the first biometric sensor 106 and the second biometric sensor 108 can sense the same biometric feature, but can be of different types. For example, the first biometric sensor 106 and the second biometric sensor 108 can sense fingerprint, but the first biometric sensor 106 can be capacitive type fingerprint sensor and the second biometric sensor 108 can be optical type fingerprint sensor. For example, the first biometric sensor 106 and the second biometric sensor 108 may independently be a capacitive type fingerprint sensor, an optical type fingerprint sensor or an ultrasonic type fingerprint sensor for sensing fingerprints or palm prints. The first biometric sensor 106 and the second biometric sensor 108 may independently include a face identification sensor for sensing human face feature or an iris recognition sensor for sensing human iris feature.

For reducing the first biometric sensor 106 and the second biometric sensor 108 from damage or break due to the folding of the foldable display device 100, the first biometric sensor 106 and the second biometric sensor 108 may be not disposed in the foldable region FR. For example, a distance D between the first biometric sensor 106 and the second biometric sensor 108 along a first direction LD is less than or equal to W/5 and greater than or equal to 3 mm, where W is a length of the flexible substrate 102 along the first direction LD when the foldable display device 100 is unfolded. In some embodiments, the first direction LD may be perpendicular to the folding axis FX.

In this embodiment, the display layer 104 may not fully cover the flexible substrate 102, so the foldable display device 100 may further have a first non-display region NR1 outside the first display region DR1, the second display region DR2 and the foldable region FR and at a side S1 of the foldable region FR. A ratio of an area of the first biometric sensor 106 to an area of the first display region DR1 may be in a range of 0.1 to 1.2. For example, the first non-display region NR1 is disposed in the first flat region FL1, and the first biometric sensor 106 may extend into the first non-display region NR1 while the second biometric sensor 108 is fully disposed in the second display region DR2, such that a part of the first biometric sensor 106 may be disposed at a side S3 of the first display region DR1. In some embodiments, a part of the first biometric sensor 106 may be disposed at at least two sides (e.g. sides S3, S4) of the first display region DR1. For example, the first biometric sensor 106 may cover at least a part of the first display region DR1 and at least a part of the first non-display region NR1, such that the area of the first biometric sensor 106 is greater than the area of the first display region DR1. In some embodiments, the first biometric sensor 106 may be fully disposed in the first display region DR1.

Besides, the foldable display device 100 may further have a second non-display region NR2 outside the first display region DR1, the second display region DR2 and the foldable region FR and at another side S2 of the foldable region FR. In some embodiments, the second biometric sensor 108 may extend into the second non-display region NR2 while the first biometric sensor 106 is fully disposed in the first display region DR1 or extends into the first non-display region NR1, such that a part of the second biometric sensor 108 may be disposed at a side S5 of the second display region DR2. In some embodiments, a part of the second biometric sensor 108 may be disposed at at least two sides (e.g. sides S5, S6) of the second display region DR2. For example, the second biometric sensor 108 may cover at least a part of the second display region DR2 and at least a part of the second non-display region NR2. In some embodiments, second biometric sensor 108 may be fully disposed in the second display region DR2.

In some embodiment, the first biometric sensor 106 and the second biometric sensor 108 may be of different areas or same area. In some embodiment, the first biometric sensor 106 and the second biometric sensor 108 may be of different shapes or same shape. It is noted that the area of the biometric sensor may be defined according to the type of the biometric sensor. The definition of the area of the biometric sensor is further detailed in the following embodiments.

The foldable display device of the present disclosure is not limited to the above embodiment. Further embodiments of the present disclosure are described below. To compare the embodiments conveniently and simplify the description, the same component would be labeled with the same symbol in the following. The following description will detail the dissimilarities among different embodiments and the identical features will not be redundantly described.

Figure 3:
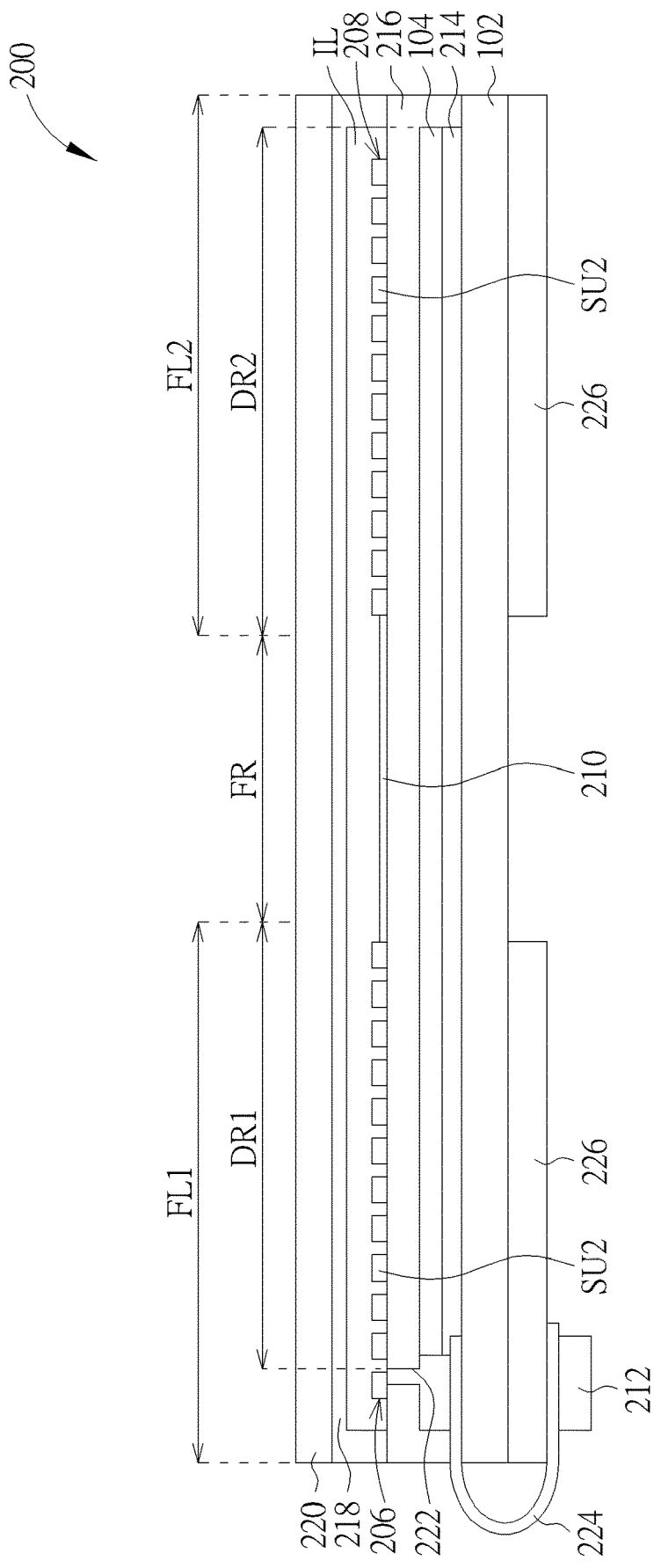
FIG. 3 schematically illustrates a cross-sectional view of a foldable display device according to a second embodiment of the present disclosure.

Refer to FIG. 3 which schematically illustrating a cross-sectional view of a foldable display device according to a second embodiment of the present disclosure. In this embodiment, the first biometric sensor 206 and the second biometric sensor 208 are capacitive type fingerprint sensors as an example. The display layer 104 is disposed between the first biometric sensor 206 and the flexible substrate 102 and between the second biometric sensor 208 and the flexible substrate 102. In other words, the first biometric sensor 206 and the second biometric sensor 208 are disposed on the display layer 104, such that the first biometric sensor 206 and the second biometric sensor 208 may be close to the biological object, such as finger or palm, for effectively sensing the biological features of the biological object. In some embodiments, the foldable display device 200 may further include a protective layer 216 disposed between the display layer 104 and the first biometric sensor 206 and between the display layer 104 and the second biometric sensor 208, and the protective layer 216 covers the display layer 104 for protecting the display layer 104 and the layers under the display layer 104. For example, the protective layer 216 may include a stack of inorganic layer, organic layer and inorganic layer, but not limited thereto.

Each of the first biometric sensor 206 and the second biometric sensor 208 may include a plurality of senor units SU2. It is noted that the first biometric sensor 206 and the second biometric sensor 208 are different from a capacitive type touch sensor for sensing position of the touch object. Specifically, in order to effectively sense biological features, the pitch of any two adjacent sensor units SU2 is less than the pitch of any two adjacent sensor units of the touch sensor, which means density of the sensor units SU2 of the biometric sensor in an unit area is higher than density of the sensor units of the touch sensor in the same unit area. The unit area may be equal to 3 cm*3 cm or 1 cm*1 cm. Also, in this embodiment, the area of the first biometric sensor 206 is defined by connecting the outer sides of the outmost sensor units SU2 of the first biometric sensor 206, and the area of the second biometric sensor 208 can be defined in the same way. In some embodiments, the sensor units SU2 may include one transparent conductive layer. For example, the transparent conductive layer may include a plurality of sensing pads for forming the sensor units SU2 respectively. In some embodiments, the sensor units SU2 may include two transparent conductive layers. For example, one of the transparent conductive layers may include a plurality of first electrode strings arranged along one direction, and the other one includes a plurality of second electrode strings arranged along another direction and crossing the first electrode strings. In some embodiments, at least one of the first biometric sensor 206 and the second biometric sensor 208 may be integrated with a capacitive type touch sensor that is also disposed on the display layer 104 or integrated with an integration of the capacitive type touch sensor and a capacitive folding sensor. In some embodiments, foldable display device 200 may further include an insulating layer IL covering the first biometric sensor 206 and the second biometric sensor 208 for protecting them. The insulating layer IL may extend into the foldable region FR or be not disposed in the foldable region FR. The design of the sensor units SU2 of the present disclosure is not limited to the mentioned above.

The foldable display device 200 may further include a first control unit 212 (such as an integrated circuit (IC)), and at least one of the first biometric sensor 206 and the second biometric sensor 208 is controlled by the first control unit 212. In this embodiment, the foldable display device 200 may further include at least one signal line 210 disposed in the foldable region FR. The signal line 210 may cross the foldable region FR from the second display region DR2 to the first display region DR1, such that both of the first biometric sensor 206 and the second biometric sensor 208 may be commonly controlled by the same first control unit 212. Specifically, the first control unit 212 may be disposed in the first flat region FL1 and on a back side of the flexible substrate 102 while the display layer 104 is disposed on a front side of the flexible substrate 102. The signal line 210 may electrically connect the first biometric sensor 206 to the second biometric sensor 208, so the second biometric sensor 208 may be electrically connected to the first control unit 212 through the signal line 210 and the first biometric sensor 206. In some embodiments, the signal line 210 may be insulated from the first biometric sensor 206 and extends across the first display region DR1, so the first biometric sensor 206 and the second biometric sensor 208 are separately electrically connected to the first control unit 212. In some embodiments, the first control unit 212 may be disposed in the second flat region FL2 and on the back side of the flexible substrate 102, and the first biometric sensor 206 is electrically connected to the first control unit 212 through the signal line 210. In some embodiments, the foldable display device 200 may further include a second control unit (not shown), and the first biometric sensor 206 and the second biometric sensor 208 are controlled by the first control unit 212 and the second control unit respectively. In such situation, no signal line is required in the foldable display device 200 to electrically connect the second biometric sensor 208 to the first control unit 212. In some embodiments, the first control unit 212 may also be electrically connected to the display layer 104 for driving the display layer 104, which means the display layer 104 and at least one of the first biometric sensor 206 and the second biometric sensor 208 may be commonly controlled by the same first control unit 212. In some embodiments, the display layer 104, the first biometric sensor 206 and the second biometric sensor 208 may be commonly controlled by the same first control unit 212.

Figure 4A:
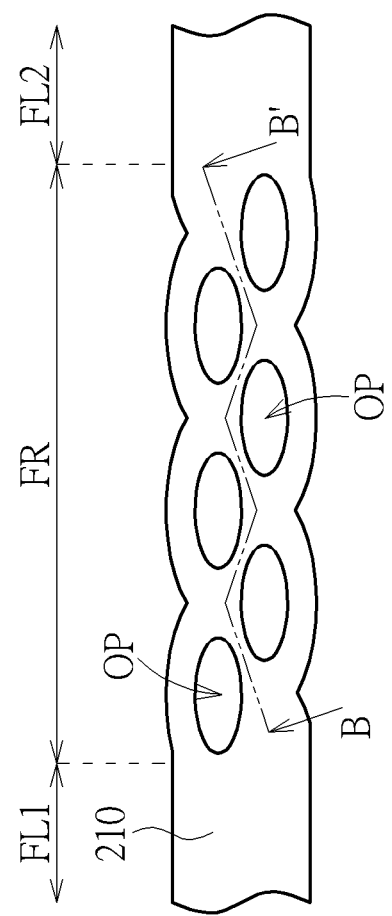
FIG. 4A schematically illustrates a top view of the signal line according to the second embodiment of the present disclosure.
Figure 4B:
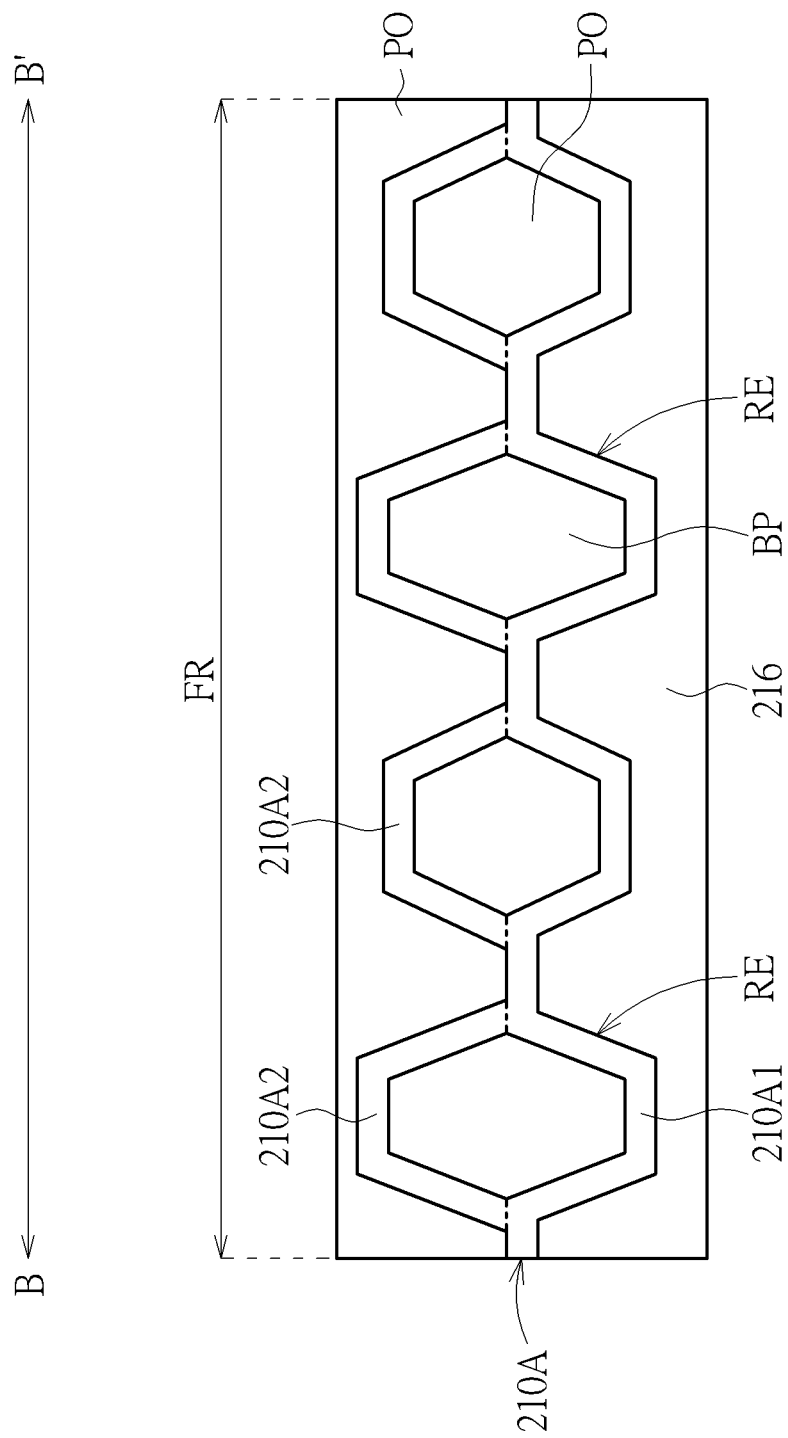
FIG. 4B schematically illustrates a cross-sectional view of the signal line according to some embodiments of the present disclosure.

In some embodiments, the signal line 210 may include an anti-breaking structure. For example, refer to FIG. 4A which schematically illustrating a top view of the signal line according to the second embodiment of the present disclosure. The signal line 210 may include a plurality of openings OP disposed in the foldable region FR for increasing the flexibility of the signal line 210. Refer to FIG. 4B which schematically illustrating a cross-sectional view of the signal line according to some embodiments of the present disclosure. FIG. 4B can be a cross-sectional view of a signal line without openings, or a cross-sectional view of the signal line in FIG. 4A along a line B-B'. As shown in FIG. 4B, the signal line 210A may include at least one uneven segment 210A1. Specifically, a part of the protective layer 216 or other insulating layer under the signal line 210A may have a plurality of recesses RE, so the segment 210A1 of the signal line 210A disposed on the protective layer 216 and extending into the recesses RE can be uneven. In some embodiments, the signal line 210A may further include a plurality of uneven parts 210A2 on the uneven segment 210A1 and corresponding to the recesses RE respectively, and the uneven parts 210A2 contact the uneven segment 210A1. For example, a polymer layer PO may be formed on the segment 210A1 and be patterned to form a plurality of bumps BP, and then, the uneven parts 210A2 may be formed on the bumps BP and contact the uneven segment 210A1 between bumps BP. The bumps BP may have at least one difference of heights, widths or shapes. Following that, another polymer layer PO may be formed to cover the signal line 210A. With this design, the signal line 210A can have better flexibility in the foldable region FR.

Referring to FIG. 3, in some embodiments, the foldable display device 200 may further include a circuit layer 214, an adhesive layer 218 and a cover layer 220. The circuit layer 214 may be fabricated by thin-film transistor processes and include a plurality of TFTs for controlling the light-emitting diodes of the display layer 104. For example, the circuit layer 214 is disposed between the display layer 104 and the flexible substrate 102. The adhesive layer 218 is used to attach the insulating layer IL that is formed on the flexible substrate 102 to the cover layer 220. In some embodiments, the foldable display device 200 may further include a via 222 in the protective layer 216 and a flexible circuit board 224 for electrically connecting the first biometric sensor 206 and the second biometric sensor 208 to the first control unit 210, and the display layer 104 may be electrically connected to the first control unit 212 through the circuit layer 214 and the flexible circuit board 224. The electrical connection between the first control unit 212 and the first biometric sensor 206, the electrical connection between the first control unit 212 and the second biometric sensor 208 and the electrical connection between the first control unit 212 and the display layer 104 are not limited to the mentioned above and may be adjusted according to the requirements.

Referring to FIG. 3, in some embodiments, the foldable display device 200 may further include two supporting films 226 disposed on the back side of the flexible substrate 102 for supporting the flexible substrate 102 and the components disposed on the flexible substrate 102. For example, the supporting films 226 may include a rigid substrate, such as a glass substrate. For reducing the display layer 104 and circuit layer 214 in the foldable region FR from damage due to folding, the supporting films 226 may be not disposed in the foldable region FR.

Figure 5:
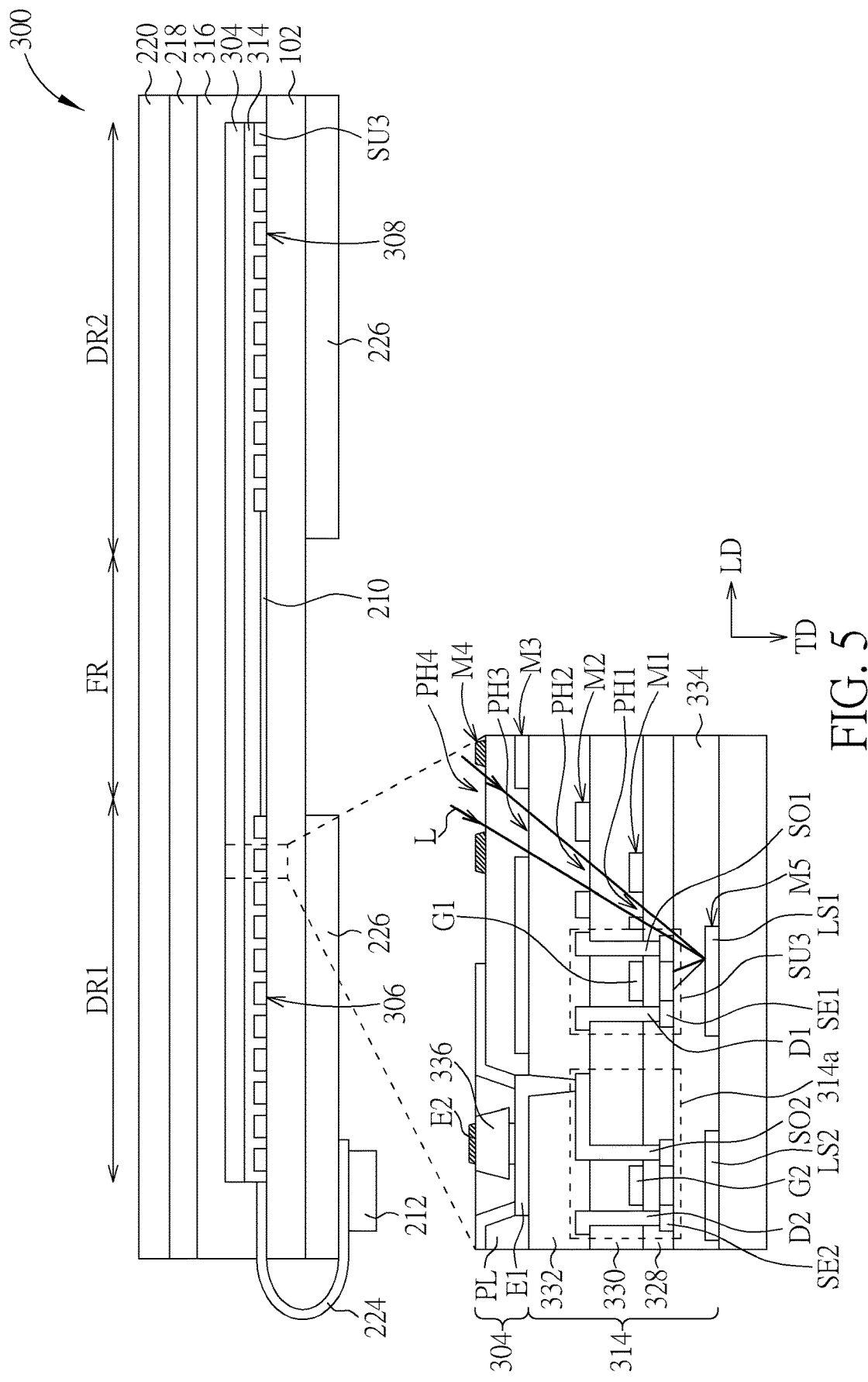
FIG. 5 schematically illustrates a cross-sectional view of a foldable display device according to a third embodiment of the present disclosure.

Refer to FIG. 5 which schematically illustrates a cross-sectional view of a foldable display device according to a third embodiment of the present disclosure. The foldable display device 300 of this embodiment is different from the second embodiment in that the first biometric sensor 306 and the second biometric sensor 308 are optical type fingerprint sensors and are embedded in the circuit layer 314 and disposed between the display layer 304 and the flexible substrate 102. In other words, the first biometric sensor 306 and the second biometric sensor 308 may be an optical thin-film transistor-type fingerprint sensor, and the sensor units SU3 of the first biometric sensor 306 and the second biometric sensor 308 may be formed with TFTs 314a of the circuit layer 314 that is used for driving the light-emitting diodes 336 in the display layer 304.

For illustration, an exemplary enlarged part shown in FIG. 5 shows one sensor unit SU3 of the first biometric sensor 306 and one TFT 314a as an example, but the present disclosure is not limited thereto. In some embodiments, the sensor unit SU3 of the first biometric sensor 306 may be a thin-film transistor that includes a first gate electrode G1, a first source electrode SO1, a first drain electrode D1 and a first semiconductor island SE1. The TFT 314a includes a second gate electrode G2, a second source electrode 502, a second drain electrode D2 and a second semiconductor island SE2. The first semiconductor island SE1 and the second semiconductor island SE2 may be disposed on the flexible substrate 102 and include same semiconductor material with same doping or with different doping, or different semiconductor materials based on the characteristics of the sensor units SU3 and the TFTs 314a. A first insulating layer 328 may be disposed on the first semiconductor island SE1 and the second semiconductor island SE2. The first gate electrode G1 may be disposed on the first insulating layer 328 and above the first semiconductor islands SE1 respectively. The second gate electrode G2 may be disposed on the first insulating layer 328 and above the second semiconductor islands SE2 respectively. The first gate electrode G1 and the second gate electrode G2 may include a same first metal layer M1 of the circuit layer 314.

A second insulating layer 330 may be disposed on the first metal layer M1. The first source electrode SO1 and the first drain electrode D1 may be disposed on the second insulating layer 330 and penetrate through the second insulating layer 330 and the first insulating layer 328 to contact two ends of the first semiconductor island SE1. The second source electrode 502 and the second drain electrode D2 may be disposed on the second insulating layer 330 and penetrate through the second insulating layer 330 and the first insulating layer 328 to contact two ends of the second semiconductor island SE2. The first source electrode SO1, the first drain electrode D1, the second source electrode 502 and the second drain electrode D2 may include a same second metal layer M2 of the circuit layer 314. A planarization layer 332 may be disposed on the second metal layer M2 and the second insulating layer 330. Also, for preventing ambient light entering the foldable display device 300 from the flexible substrate 102 from illuminating the first semiconductor island SE1 and the second semiconductor island SE2, the circuit layer 314 includes a first light-shielding portion LS1 between the first semiconductor island SE1 and the flexible substrate 102 and a second light-shielding portion LS2 between the second semiconductor island SE2 and the flexible substrate 102. For example, the first light-shielding portion LS1 and the second light-shielding portion LS2 may include a same metal layer M5, and a third insulating layer 334 may be disposed between the metal layer M5 and the semiconductor islands. Light L penetrating through the inner surface of the foldable display device 300 may be reflected by the first light-shielding portion LS1 to the first semiconductor island SE1. In some embodiments, the first metal layer M1 and the second metal layer M2 may include pin holes PH1, PH2 for allowing the light L penetrating through. In some embodiments, the structure of the sensor unit SU3 of the second biometric sensor 308 may be the same as that of the first biometric sensor 306 and will not be detailed redundantly.

Further referring to FIG. 5, in some embodiments, the display layer 304 may further include a plurality of light-emitting diodes 336, a third metal layer M3, a partition layer PL and a fourth metal layer M4. The third metal layer M3 may include an electrode E1 penetrating through the planarization layer 332 for electrically connecting one corresponding light-emitting diode 336 to the corresponding TFT 314a. The partition layer PL may have a cup for disposing the corresponding light-emitting diode 336. The fourth metal layer M4 may include another electrode E2 on the corresponding light-emitting diode 336. Also, for allowing the light L penetrating through the third metal layer M3 and fourth metal layer M4, the third metal layer M3 and the fourth metal layer M4 may further include pin holes PH3, PH4. In this embodiment, the protective layer 316 may cover not only the display layer 304 and the circuit layer 314 but also the first biometric sensor 306 and the second biometric sensor 308. The structure of the display layer 304 is not limited to the mentioned above.

As the mentioned above, the sensor unit SU3 and the TFT 314a may be formed by the same processes, and the sensor unit SU3 may be disposed at a side of the corresponding light-emitting diode 336 in a top view direction TD for sensing the light signal. Since each sensor unit SU3 may include one thin-film transistor, the area of one thin-film transistor can define the area of one sensor unit SU3. It is noted that the biometric sensor may include the sensor units for receiving signal waves, such as light signal, but not includes signal wave generator for generating the signal waves. Accordingly, the area of the first biometric sensor 306 can be defined by connecting the outer sides of the outmost sensor units SU3 of the first biometric sensor 306, and the area of the second biometric sensor 308 can be defined in the same way. Also, the display region may be defined by connecting outer sides of the outmost light-emitting diodes 336. In some embodiments, a capacitive type touch sensor and/or a capacitive folding sensor or an integration of the capacitive type touch sensor and the capacitive folding sensor may be disposed on the display layer 304.

Figure 6:
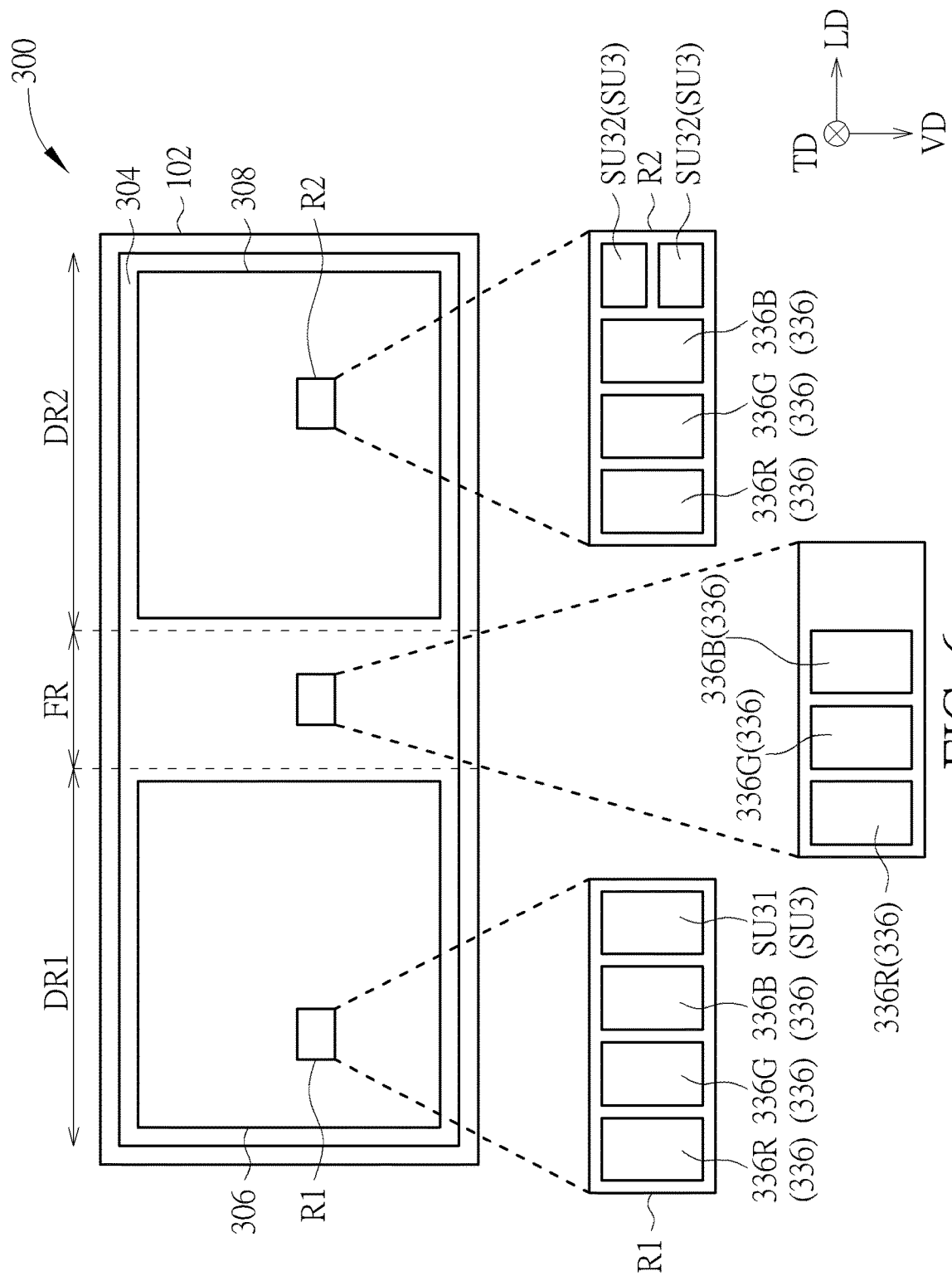
FIG. 6 schematically illustrates a top view of the foldable display device according to the third embodiment of the present disclosure.

Refer to FIG. 6 which schematically illustrates a top view of the foldable display device according to the third embodiment of the present disclosure. In the first biometric sensor 306, the sensor units SU3 are first sensor units SU31. In the second biometric sensor 308, the sensor units SU3 are second sensor units SU32. In some embodiments, a number of the first sensor units SU31 in a first region R1 of the first display region DR1 may be different from a number of the second sensor units SU32 in a second region R2 of the second display region DR2, and an area of the first region R1 is substantially equal to an area of the second region R2, such as the area of the first region R1 and the area of the second region R2 may be equal to 3 cm*3 cm or 1cm*1cm. For example, each of the first region R1 and the second region R2 may be a pixel region that has three light-emitting diodes 336, such as a red light-emitting diode 336R, a green light-emitting diode 336G and a blue light-emitting diode 336B. But, one first sensor unit SU31 is disposed in the first region R1, and two second sensor units SU32 are disposed in the second region R2. Thus, the number of the first sensor units SU31 may be less than the number of the second sensor units SU32. Also, since there is no biometric sensor in the foldable region FR, the number of the sensor units in the foldable region FR is further less than the number of the first sensor units SU31. In some embodiments, the number of the second sensor units SU32 may be less than the number of the first sensor units SU1. In some embodiments, one pixel region may have three sensor units SU3, and each sensor unit corresponds to one light-emitting diode. Alternatively, plural pixel regions may have one sensor unit SU3. In some embodiments, the number of the first sensor units SU31 may be equal to the number of the second sensor units SU32, and the arrangement of the first sensor units SU31 in the first region R1 may be different from the arrangement of the second sensor units SU32 in the second region R2. For example, when each of the first region R1 and the second region R2 has one sensor unit, the first sensor unit SU31, the red light-emitting diode 336R, a green light-emitting diode 336G and a blue light-emitting diode 336B may be arranged along the first direction LD, and the second sensor unit SU32 and the three light-emitting diodes 336 are arranged along a second direction VD that is different from the arranged direction of the light-emitting diodes 336. In some embodiments, when the number of the first sensor units SU31 is equal to the number of the second sensor units SU32, and the size of the first sensor units SU31 in the first region R1 may be different from the size of the second sensor units SU32 in the second region R2. In some embodiments, the difference in number, difference in arrangement, and/or difference in size of the sensor units in different biometric sensors may also apply to different types of biometric sensors, such as the capacitive type fingerprint sensor, the ultrasonic type fingerprint sensor, the face identification sensor or the iris recognition sensor.

Figure 7:
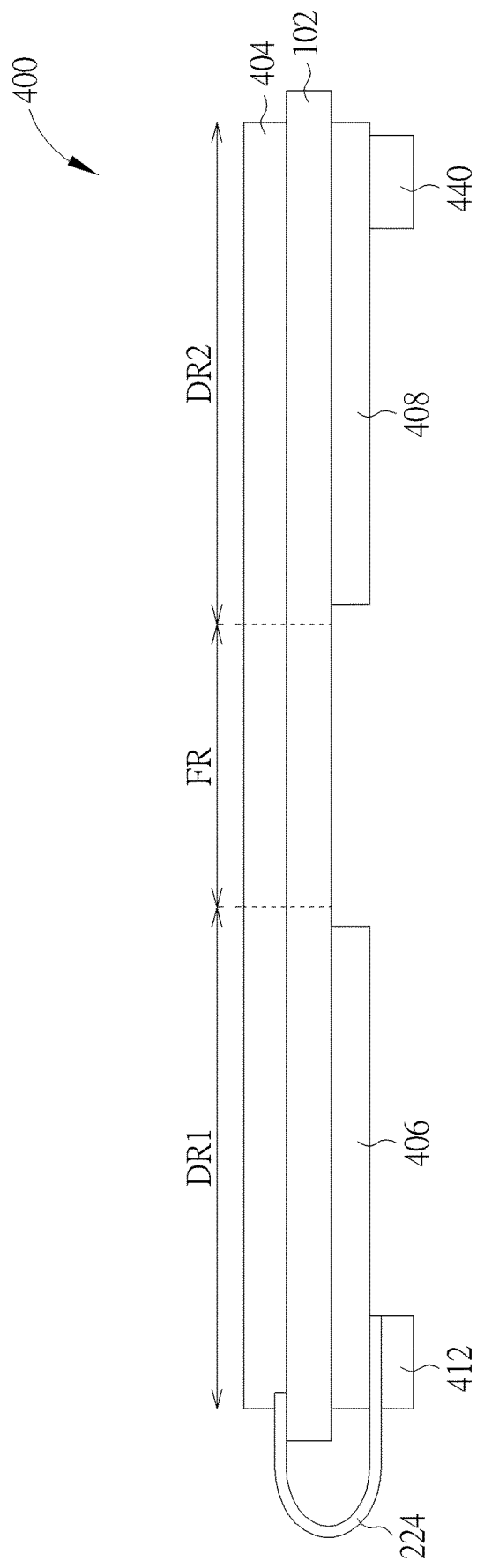
FIG. 7 schematically illustrates a cross-sectional view of a foldable display device according to a fourth embodiment of the present disclosure.

Refer to FIG. 7 which schematically illustrates a cross-sectional view of a foldable display device according to a fourth embodiment of the present disclosure. The foldable display device 400 of this embodiment is different from the third embodiment in that the first biometric sensor 406 and the second biometric sensor 408 are disposed on the back side of the flexible substrate 102 while the display layer 404 is disposed on the front side of the flexible substrate 102. For clarity, FIG. 7 omits the circuit layer, the cover layer, the adhesive layer and protective layer, but the present disclosure is not limited thereto. In this embodiment, the first biometric sensor 406 and the second biometric sensor 408 may be an optical type fingerprint sensor chip, and be attached to the back side of the flexible substrate 102 through adhesive layers. It is noted that because the first biometric sensor 406 and the second biometric sensor 408 can be directly disposed on the flexible substrate 102 and used for supporting the flexible substrate 102 and the display layer 404 on the flexible substrate 102, the supporting film may not be required in the foldable display device 400. In some embodiments, the foldable display device 400 may still have the supporting film between each biometric sensor and the flexible substrate. In some embodiments, there is no signal line between the first biometric sensor 406 and the second biometric sensor 408, and the foldable display device 400 may include a first control unit 412 and a second control unit 440 respectively controlling the first biometric sensor 406 and the second biometric sensor 408. In such situation, the first control unit 412 may be disposed on a surface of the first biometric sensor 406 opposite to the flexible substrate 102, and the second control unit 440 may be disposed on a surface of the second biometric sensor 408 opposite to the flexible substrate 102. In some embodiments, the display layer 404 may be electrically connected to the first control unit 412 through the flexible circuit board 224. Alternatively, the display layer 404 may be electrically connected to and controlled by another control unit (not shown) that is disposed on the back side of the flexible substrate 102. In some embodiments, the first biometric sensor 406 and the second biometric sensor 408 may further include a collimator (not shown) for filtering light. In some embodiments, a capacitive type touch sensor and/or a capacitive folding sensor or an integration of the capacitive type touch sensor and the capacitive folding sensor may be disposed on the display layer 404. In such situation, the touch sensing area of the touch sensor may be greater than the area of the biometric sensor.

In some embodiments, at least one of the first biometric sensor 406 and the second biometric sensor 408 may be the ultrasonic type fingerprint sensor. In such situation, the first biometric sensor 406 and the second biometric sensor 408 may include transmitters and receivers. The receivers include poly-vinylidene difluoride (PVDF). Also, the transmitters include PVDF and may be formed with the receivers. It is noted that the biometric sensor may include the sensor units for receiving signal waves, such as ultrasonic signal, but not includes signal wave generator for generating the signal waves. Accordingly, the area of the first biometric sensor 406 can be defined by connecting the outer sides of the outmost sensor units of the first biometric sensor 406, and the area of the second biometric sensor 408 can be defined in the same way. In some embodiments, when the first biometric sensor 406 and the second biometric sensor 408 are the ultrasonic type fingerprint sensors, a thin-film transistor layer may be formed between the first biometric sensor 406 and the flexible substrate 102 and between the second biometric sensor 408 and the flexible substrate 102 and may cross the foldable region FR to electrically connect the second biometric sensor 408 to the first control unit 412.

Figure 8:
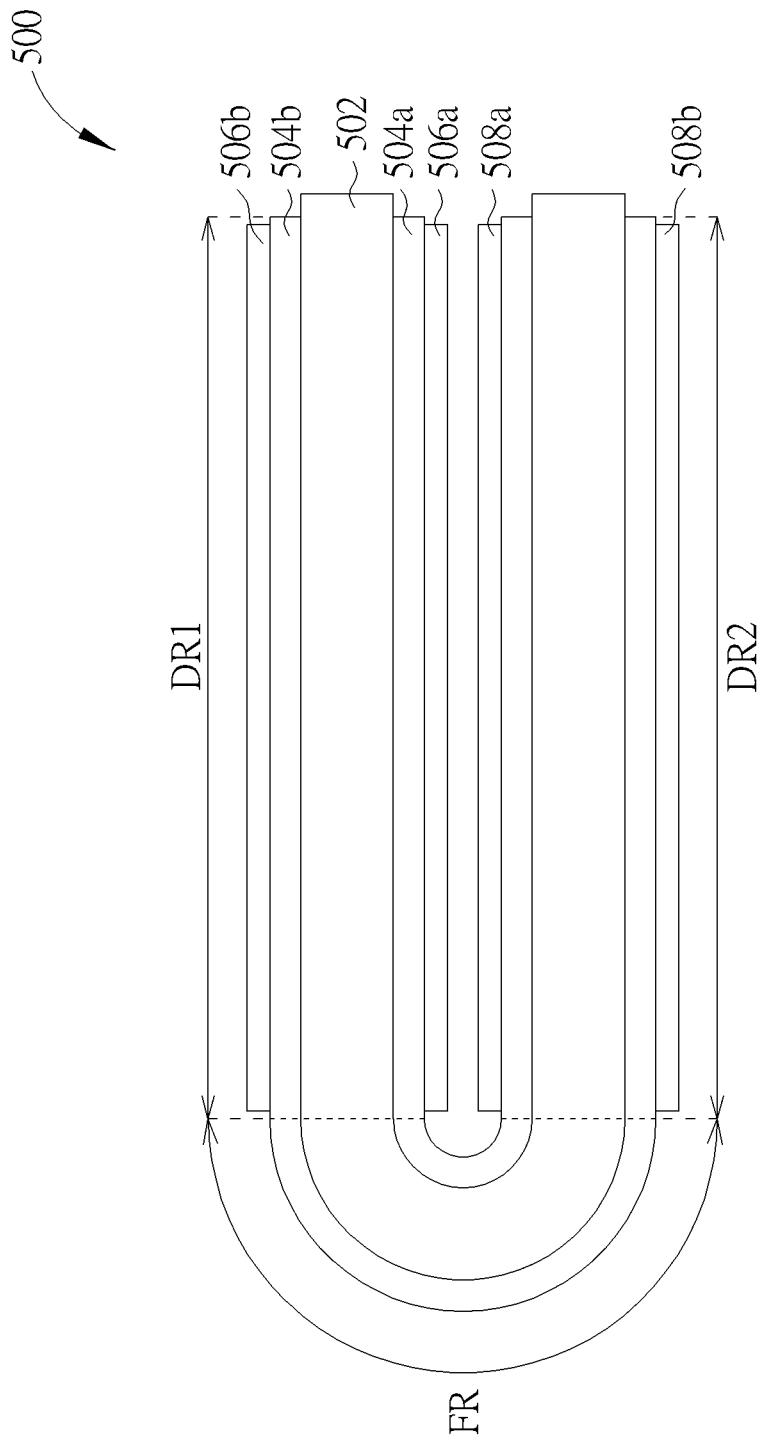
FIG. 8 schematically illustrates a cross-sectional view of a foldable display device when the foldable display device is at the folded state according to a fifth embodiment of the present disclosure.

Refer to FIG. 8 which schematically illustrates a cross-sectional view of a foldable display device when the foldable display device is at the folded state according to a fifth embodiment of the present disclosure. The foldable display device 500 of this embodiment is different from the first embodiment in that the foldable display device 500 is a double side display device. Specifically, the foldable display device 500 includes the flexible substrate 502, a first display layer 504a, a second display layer 504b, two first biometric sensors 506a, 506b in the first display region DR1 and two biometric sensors 508a, 508b in the second display region DR2. The first display layer 504a and the second display layer 504b are disposed on the two opposite sides of the flexible substrate 502 respectively. The first biometric sensor 506a and the second biometric sensor 508a are used for sensing the biological feature from the inner surface of the foldable display device 500, and the first biometric sensor 506b and the second biometric sensor 508b are used for sensing the biological feature from the outer surface of the foldable display device 500. The first biometric sensors 506a, 506b and the second biometric sensors 508a, 508b may respectively adopt the first biometric sensor and the second biometric sensor of any one aforementioned embodiment, and the structures thereof will not be detailed herein. In some embodiments, the first biometric sensor 506a and the second biometric sensor 508a may be disposed on the first display layer 504a, between the first display layer 504a and the flexible substrate 502 or within the flexible substrate 502. The first biometric sensor 506b and the second biometric sensor 508b may be disposed on the second display layer 504b, between the second display layer 504b and the flexible substrate 502 or within the flexible substrate 502. In some embodiments, when the first biometric sensor 506a, the second biometric sensor 508a, the first biometric sensor 506b and/or the second biometric sensor 508b are disposed within flexible substrate 502, the flexible substrate 502 may include a plurality of substrates, and the first biometric sensor 506a, the second biometric sensor 508a, the first biometric sensor 506b and/or the second biometric sensor 508b may be disposed between the substrates. In some embodiments, the first biometric sensor 506b may be structurally symmetrical to the first biometric sensor 506a with respect to the flexible substrate 502, but the disclosure is not limited to. The second biometric sensor 508b may be structurally symmetrical to the second biometric sensor 508a with respect to the flexible substrate 502, but the disclosure is not limited to.

Figure 9:
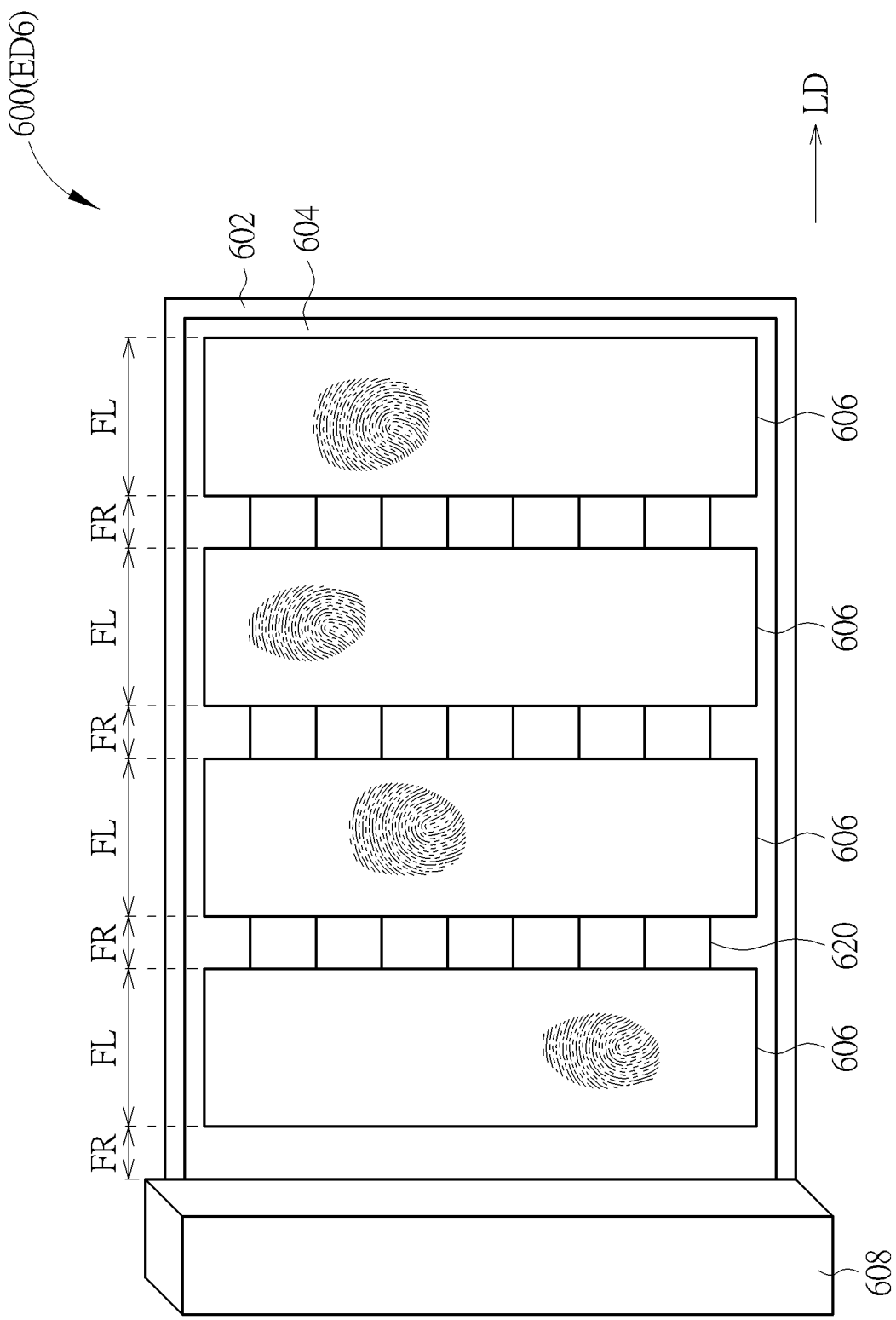
FIG. 9 schematically illustrates a top view of a rollable electronic device according to a sixth embodiment of the present disclosure.

Refer to FIG. 9 which schematically illustrates a top view of a rollable electronic device according to a sixth embodiment of the present disclosure. The electronic device ED6 of this embodiment is different from the first embodiment in that the electronic device ED6 is a rollable display device 600. The rollable display device 600 may include a flexible substrate 602, a display layer 604 and a plurality of biometric sensors 606. Also, the rollable display device 600 may has a plurality of foldable regions FR and a plurality of flat regions FL, in which each foldable region FR and each flat region FL are alternately arranged along a first direction LD. Through bending the foldable regions FR, the rolling of the rollable display device 600 can be achieved. The display layer 604 may extend across all of the foldable regions and the flat regions FL, and each biometric sensor 606 is disposed in one corresponding flat region FL. Since the rollable display device 600 includes plural biometric sensors 606, plural biological features, such as fingerprints of one hand, may be sensed together by the rollable display device 600. In some embodiments, the rollable display device 600 may further include a plurality of signal lines 620 disposed between any adjacent two of the biometric sensors 606. In some embodiments, the biometric sensors 606 may be rigid and can define the flat regions FL respectively. In some embodiments, the rollable display device 600 may further include a housing 608 for accommodating the rolled flexible substrate 602, the rolled display layer 604 and the biometric sensors 606 when the rollable display device 600 is rolled.

Figure 10:
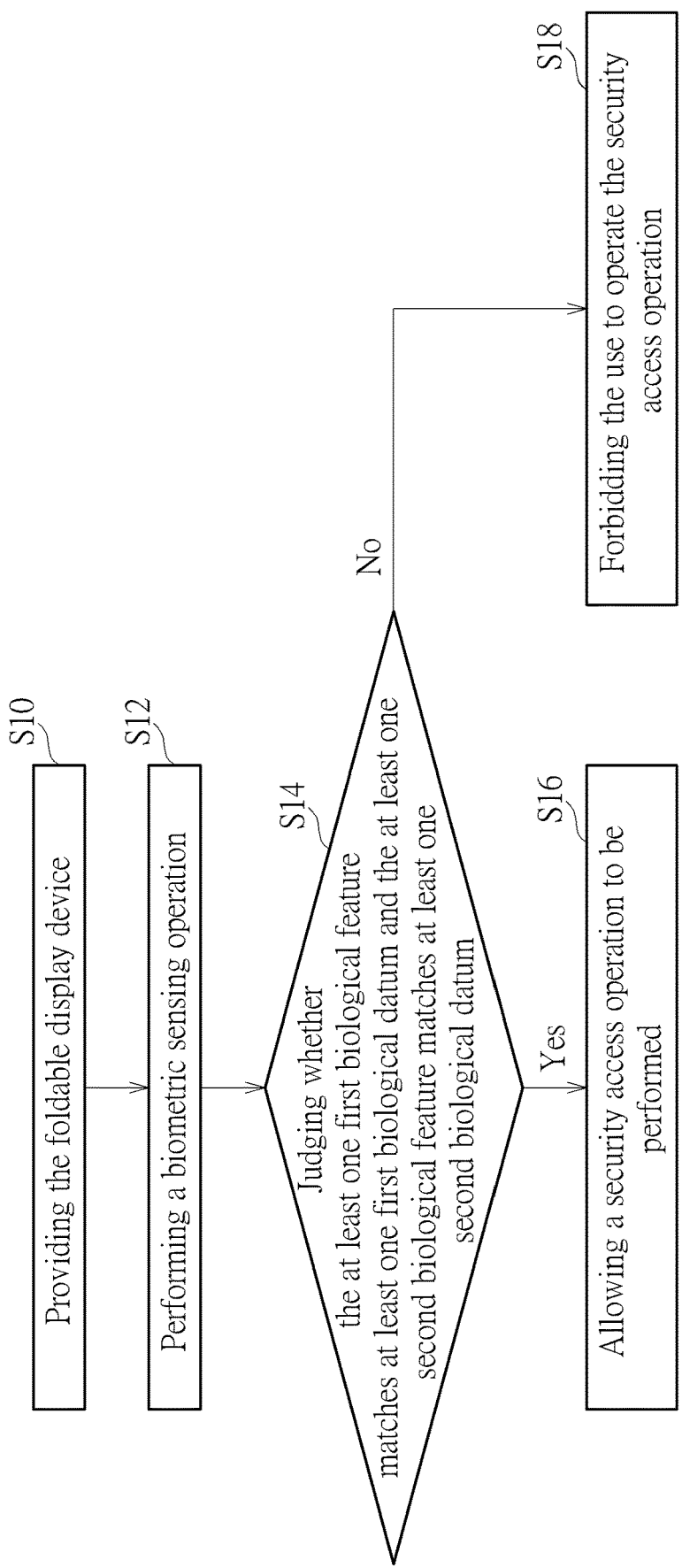
FIG. 10 illustrates a follow chart of a method for driving a foldable display device according to a seventh embodiment of the present disclosure.

Refer to FIG. 10 together with FIG. 2. FIG. 10 illustrates a follow chart of a method for driving a foldable display device according to a seventh embodiment of the present disclosure. The method for driving the foldable display device will be described with reference to FIG. 2 and FIG. 10. For illustration, the foldable display device 100 of the first embodiment is taken as an example, but the present disclosure is not limited thereto. The foldable display devices of other aforementioned embodiments may be applied to the method.

In step S10, the foldable display device 100 is provided. A plurality of biological data may be stored, for example in the foldable display device 100 or a memory device that allow the foldable display device 100 to access. For example, the biological data may include fingerprints of different fingers, eye feature, face feature, iris feature or other suitable recognition feature of at least one specific person, in which the specific person may be an owner of the foldable display device 100 or another person that the owner allows. The biological data may be stored by the specific person into the foldable display device 100 or the memory device. In some embodiments, the biological data may be pre-stored in the foldable display device 100 or the memory device, and the step S10 may be omitted. In the step of providing the foldable display device 100, the first biometric sensor 106 disposed in the first display region DR1 and the second biometric sensor 108 disposed in the second display region DR2 shown in FIG. 2 may be turned on. For example, the turning on of the first biometric sensor 106 and the second biometric sensor 108 may be performed by switching on the power of the foldable display device 100 or executing a specific function, such as executing a mobile payment or opening a mobile application.

Subsequently, in step S12, a biometric sensing operation is performed, which includes using the first biometric sensor 106 to detect at least one first biological feature of a user and using the second biometric sensor 108 to detect at least one second biological feature of the user in a period of time. The period of time may for example be within 1 sec or a predetermined time. In some embodiments, the first biological feature and the second biological feature may be detected by the first biometric sensor 106 and the second biometric sensor 108 at the same time. In some embodiments, the first biometric sensor 106 may detect plural first biological features, such as two different fingerprints. In some embodiments, the first biometric sensor 106 and/or the second biometric sensor 108 may be used to detect palm prints.

After detecting the first biological feature and the second biological feature of the user, step S14 is performed to judge whether the at least one first biological feature matches at least one first biological datum of the biological data and the at least one second biological feature matches a second biological datum of the biological data by the control unit of the foldable display device 100. For example, the at least one first biological datum and the at least one second biological datum may be two different fingerprints or palm prints of the user respectively.

In step S16, when the at least one first biological feature matches the at least one first biological datum and the at least one second biological feature matches the second biological datum, a security access operation is performed by the control unit of the foldable display device 100, such that the user may access an information with security. For example, the user may be allowed to transfer money or to access private information.

In step S18, when the at least one first biological feature does not match the at least one first biological datum or the at least one second biological feature does not match the second biological datum, the user is forbidden to operate the security access operation.

In some embodiments, the control unit may further judge whether the at least one first biological feature and the at least one second biological feature match a predetermined condition. When the at least one first biological feature and the at least one second biological feature match the predetermined condition, an operation with higher security level may be performed. For example, the predetermined condition is that the number of the first biological feature should match a first predetermined number and/or the number of the second biological feature should match a second predetermined number. Alternatively, the predetermined condition is that the first biological feature should match fingerprint of index finger of one hand and the second biological features should match fingerprints of index finger and middle finger of another hand. The operation with higher security level may be for example an action to pay more than a certain amount of fees, such as one hundred thousand dollars. In some embodiments, the foldable display device 100 may store a plurality of predetermined conditions, and the control unit may determine one of the predetermined conditions to be used based on the security level. In such situation, when the security level is higher, the predetermined condition may require more biological data to be matched. As can be understood from the above description, more access restriction approaches can be achieved so as to increase the protection methods for information with different security levels.

Figure 11:
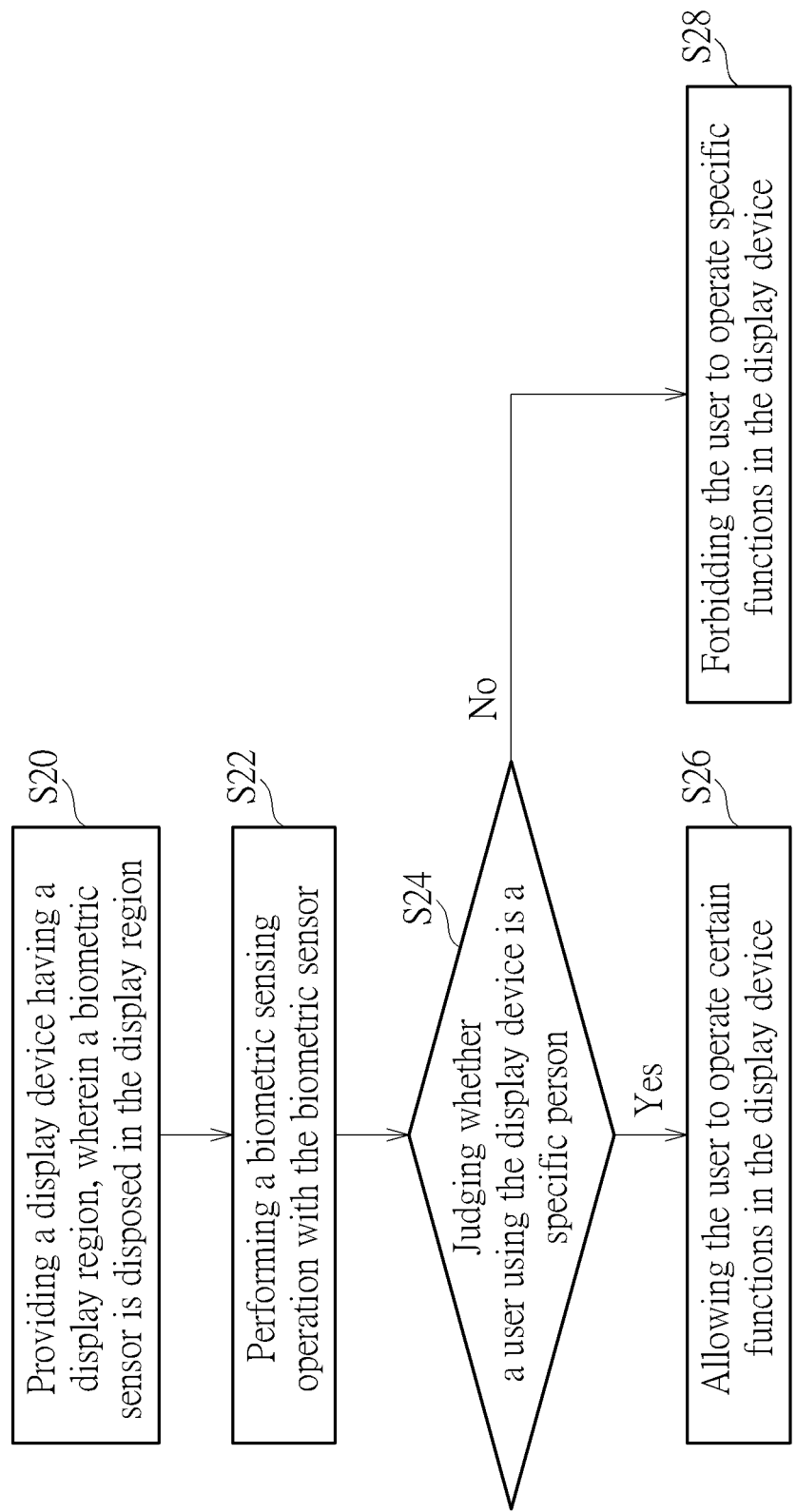
FIG. 11 illustrates a follow chart of a method for driving a foldable display device according to an eighth embodiment of the present disclosure.

Refer to FIG. 11 which illustrates a follow chart of a method for driving a display device according to an eighth embodiment of the present disclosure. The method for driving the display device will be described with reference to FIG. 2 and FIG. 11. In step S20, the display device is provided, in which the display device has a display region, and a biometric sensor is disposed in the display region. For example, the display device applied to this method may be the foldable display device 100 of the first embodiment or any one of the foldable display devices of other aforementioned embodiments. In such situation, the display region may be the first display region or the second display region mentioned in the above embodiments, and the biometric sensor may be the first biometric sensor or the second biometric sensor mentioned in the above embodiments. In some embodiments, the display device applied to the method may not be a foldable display device but an unfoldable display device.

In step S22, a biometric sensing operation is performed so as to detect a biological feature of a user using the display device. The biometric sensing operation may be performed at a certain frequency. The biometric sensing operation can be performed by the biometric sensor, similar to the above-mentioned descriptions.

In step S24, whether the user using the display device is a specific person is judged by the control unit, such that the control unit can check whether the user is the specific person. For example, the control unit may be similar to the above-mentioned descriptions. For example, the specific person may be an owner of the foldable display device 100 or another person that the owner allows. For example, when a user visits website by internet, a biometric sensing operation can be performed at a certain frequency, for example, every 10 minutes, to detect whether the user is the specific person (the owner).

In step S26, when the user is the specific person, allowing the user to operate certain functions in the display device. For example, when the control unit judges the user is the owner, the user can access all of data stored in the foldable display device 100, such as private pictures or confidential data. When the control unit judges the user is the certified users, the user can access some of data stored in the foldable display device 100, such as advanced modification function.

In step S28, when the user is not the specific person, the user is forbidden to operate specific functions in the display device. For example, when the control unit judge the user is not the specific person, such as a child that the owner does not allow, the user cannot access some private data stored in the foldable display device 100. In details, according to some embodiments, the child user that is not the owner can still access public data and operate public function (for example, the child user can still visit website by internet), but cannot access some private data. Through the method, the foldable display device 100 can avoid some private data being accessed by the user.

In summary, according to some embodiments, the foldable display device of the present disclosure includes a first biometric sensor disposed in the first display region and a second biometric sensor disposed in the second display region, more access restriction approaches can be achieved so as to increase the protection methods for information with different security levels.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A foldable display device having a first display region, a second display region, and a foldable region connecting the first display region and the second display region, the foldable display device comprising:
   a first biometric sensor disposed in the first display region;
   a second biometric sensor disposed in the second display region; and
   a signal line electrically connecting between the first biometric sensor and the second biometric sensor, wherein the signal line crosses a region without the first biometric sensor and the second biometric sensor in a top view, wherein a distance between the first biometric sensor and the second biometric sensor along a direction is less than or equal to W/5 and greater than or equal to 3 mm, wherein W is a length of the foldable display device along the direction when the foldable display device is unfolded, and wherein the direction is perpendicular to a folding axis of the foldable display device.

2. The foldable display device as claimed in claim 1, wherein a ratio of an area of the first biometric sensor to an area of the first display region is in a range of 0.1 to 1.2.

3. The foldable display device as claimed in claim 1, wherein the first biometric sensor and the second biometric sensor are of different types.

4. The foldable display device as claimed in claim 1, wherein the first biometric sensor and the second biometric sensor are of different areas.

5. The foldable display device as claimed in claim 1, wherein the signal line includes an anti-breaking structure.

6. The foldable display device as claimed in claim 5, wherein the anti-breaking structure is disposed in the foldable region.

7. The foldable display device as claimed in claim 1, wherein the foldable display device has a non-display region outside the first display region, the second display region and the foldable region, and at least one of the first biometric sensor and the second biometric sensor extends into the non-display region.

8. The foldable display device as claimed in claim 1, further comprising a first control unit and a second control unit, wherein the first biometric sensor and the second biometric sensor are controlled by the first control unit and the second control unit respectively.

9. The foldable display device as claimed in claim 1, further comprising a control unit, wherein the first biometric sensor and the second biometric sensor are commonly controlled by the control unit.

10. The foldable display device as claimed in claim 1, further comprising a control unit and a display layer, wherein the display layer and at least one of the first biometric sensor and the second biometric sensor are commonly controlled by the control unit.

11. The foldable display device as claimed in claim 1, further comprising a flexible substrate and a display layer, wherein the display layer is disposed between the first biometric sensor and the flexible substrate.

12. The foldable display device as claimed in claim 1, further comprising a flexible substrate and a display layer, wherein the first biometric sensor is disposed between the display layer and the flexible substrate.

13. The foldable display device as claimed in claim 1, further comprising a flexible substrate and a display layer, wherein the flexible substrate is disposed between the display layer and the first biometric sensor.

14. The foldable display device as claimed in claim 13, wherein the first biometric sensor is directly disposed on the flexible substrate and for supporting the flexible substrate.

15. The foldable display device as claimed in claim 1, wherein the first biometric sensor comprises a plurality of first sensor units, the second biometric sensor comprises a plurality of second sensor units, a number of the first sensor units in a first region of the first display region is different from a number of the second sensor units in a second region of the second display region, and an area of the first region is equal to an area of the second region.

16. The foldable display device as claimed in claim 1, wherein the first biometric sensor and the second biometric sensor independently is a capacitive type fingerprint sensor, an optical type fingerprint sensor, an ultrasonic type fingerprint sensor, a face identification sensor or an iris recognition sensor.

17. A method for driving a foldable display device, the foldable display device having a first display region, a second display region, and a foldable region connecting the first display region and the second display region, the method comprising:
providing a signal line, a first biometric sensor and a second biometric sensor, wherein the first biometric sensor and the second biometric sensor are disposed in the first display region and the second display region of the foldable display device respectively, and in a top view, the signal line crosses a region without the first biometric sensor and the second biometric sensor to electrically connects between the first biometric sensor and the second biometric sensor wherein a distance between the first biometric sensor and the second biometric sensor along a direction is less than or equal to W/5 and greater than or equal to 3 mm, wherein W is a length of the foldable display device along the direction when the foldable display device is unfolded, and wherein the direction is perpendicular to a folding axis of the foldable display device;
performing a biometric sensing operation, which comprises using the first biometric sensor to detect at least one first biological feature and using the second biometric sensor to detect at least one second biological feature in a period of time; and
when the at least one first biological feature matches at least one first biological datum and the at least one second biological feature matches at least one second biological datum, allowing a security access operation to be performed by the foldable display device.

18. A method for driving a display device, comprising:
providing the display device having a display region and another display region, wherein a biometric sensor is disposed in the display region, another biometric sensor is disposed in the another display region, and in a top view, a signal line crosses a region without the first biometric sensor and the second biometric sensor to electrically connects between the biometric sensor and the another biometric sensor wherein a distance between the first biometric sensor and the second biometric sensor along a direction is less than or equal to W/5 and greater than or equal to 3 mm, wherein W is a length of the foldable display device along the direction when the foldable display device is unfolded, and wherein the direction is perpendicular to a folding axis of the foldable display device;
performing a biometric sensing operation with the biometric sensor;
judging whether a biological feature matches a predetermined condition;
when the biological feature matches the predetermined condition, allowing operating certain functions in the display device; and
when the biological feature doesn't match the predetermined condition, forbidding operating specific functions in the display device.

* * * * *